United States Patent [19]
Clark, Jr. et al.

[11] Patent Number: 5,578,761
[45] Date of Patent: Nov. 26, 1996

[54] ADAPTIVE PIEZOELECTRIC SENSORIACTUATOR

[75] Inventors: Robert L. Clark, Jr., Durham; Jeffrey S. Vipperman, Hillborough, both of N.C.; Daniel G. Cole, Blacksburg, Va.

[73] Assignee: Duke University, Durham, N.C.

[21] Appl. No.: 519,513

[22] Filed: Aug. 25, 1995

Related U.S. Application Data

[60] Provisional application No. 60/001,663, Jul. 31, 1995.
[51] Int. Cl.$^6$ .................................................. G01B 7/16
[52] U.S. Cl. ................................. 73/769; 310/319
[58] Field of Search ........................... 73/769; 310/316, 310/317, 319

[56] References Cited

U.S. PATENT DOCUMENTS 5,347,870  9/1994  Dosch et al. .............................. 73/769

OTHER PUBLICATIONS

Cole, D. G., et al., "Adaptive Compensation of Piezoelectric Sensoriactuators," Journal of Intelligent Material Systems and Structures, vol. 5:665–671 (Sep. 1994).

Vipperman, J. S., et al., "Hybrid Analog and Digital Adaptive Compensation of Piezoelectric Sensoriactuators," *Department of Mechanical Engineering and Materials Science, Duke University, Durham, North Carolina*, pp. 1–8 (Sep. 1995).

*Primary Examiner*—Robert Raevis
*Attorney, Agent, or Firm*—Hamilton, Brook, Smith & Reynolds, P.C.

[57] ABSTRACT

An adaptive algorithm implemented in digital or analog form is used in conjunction with a voltage controlled amplifier to compensate for the feedthrough capacitance of piezoelectric sensoriactuator. The mechanical response of the piezoelectric sensoriactuator is resolved from the electrical response by adaptively altering the gain imposed on the electrical circuit used for compensation. For wideband, stochastic input disturbances, the feedthrough capacitance of the sensoriactuator can be identified on-line, providing a means of implementing direct-rate-feedback control in analog hardware. The device is capable of on-line system health monitoring since a quasi-stable dynamic capacitance is indicative of sustained health of the piezoelectric element.

16 Claims, 10 Drawing Sheets

ADAPTIVE PIEZOELECTRIC SENSORIACTUATOR

GOVERNMENT SUPPORT

The Government has rights in this invention pursuant to Federal Grant No. NAG 11570 awarded by NASA.

RELATED APPLICATIONS

This application is a Continuation-in-Part application of U.S. provisional application, Ser. No. 60/001,663, filed Jul. 31, 1995, and claims the benefit thereof.

BACKGROUND OF THE INVENTION

Recent studies have demonstrated the potential for using a piezoelectric transduction device simultaneously for sensing and actuation. Due to the stability associated with collocated transduction devices in direct feedback control loops, concurrent use of the same device as a sensor and actuator has many applications. Piezoelectric transduction devices have been suggested for use in the suppression of flutter in panels, plate-like lifting surfaces as well as in airfoils. The transduction devices have also been considered for the suppression of interior noise within the fuselage of modern aircraft and for adding damping to flexible truss structures as required for large space structures.

The piezostructure, defined to be the combination of the structure and its surface mounted or embedded piezoelectric components, can be described by the second-order MDOF equation $$\text{Actuator Eqn. } \ddot{r} + D\dot{r} + \Omega^2 r = \Theta v \quad (1)$$

$$\text{Sensor Eqn. } q = \Theta^T r + C_p v \quad (2)$$

where q is the piezoelectric's charge and v its voltage, r is in the natural (modal) basis of the structure, D describes the inherent damping, $\Omega^2$ is a diagonal matrix of system eigenvalues, $\Theta$ is the electromechanical coupling matrix, and $C_p$ is the patch capacitance matrix. Thus, if the capacitance of the piezoelectric device is known, one must simply apply the same voltage across an "identical" capacitor and subtract the electrical response from that of the sensoriactuator to resolve the mechanical response of the structure.

SUMMARY OF THE INVENTION

Small errors in the identification of the capacitance of the sensoriactuator serve to degrade the resolved mechanical response and thus the performance of the closed-loop control system, for example. Since the electromechanical properties of the transduction device are subject to change in response to time-varying environmental and operating conditions, the method of simply subtracting the response of an equivalent capacitor is inadequate for most real world applications.

According to the invention, adaptive signal processing, implemented on a digital signal processor, or alternatively in analog, is used to estimate the feedthrough capacitance of the piezoelectric device on-line. The term feedthrough capacitance is used because the capacitive electrical response of the piezoceramic patch is a feedthrough term when the system is modeled in a standard state-space configuration. The mechanical response of the piezoelectric sensoriactuator is resolved from the electrical response by adaptively altering the gain imposed on an electrical circuit used for compensation. Effectively, this allows the electrical circuit to model the capacitance of the piezoelectric device and thus its electrical response. For a broadband, stochastic input, a single coefficient adaptive filter will compensate for the feedthrough capacitance of the piezostructure. Thus, the adaptive algorithm can be used to measure the "in-situ" capacitance of the device coupled to the structure which is useful for collocated feedback control applications, such as direct-rate-feedback control, modal analysis, and impedance measurements.

In general in light of the above, the invention features an adaptive sensoriactuator system. This system comprises a sensoriactuator, such as a piezoelectric actuator in specific embodiments, for generating a sensor signal that is a function of its electrical response to an electrical input signal and its mechanical response. In one embodiment, a signal generator generates a training signal, to which the sensoriactuator is responsive. A compensator is then able to resolve the portion of the sensor signal that results from the mechanical response, when the electrical input signal is, at least in part, bandlimited noise, by estimating the electrical response from a comparison of the training signal and the sensor signal.

In more detail, the compensator comprises a modeling circuit that is responsive to the training signal and models the capacitance of the sensoriactuator to estimate the electrical response of the sensoriactuator. To accomplish this, the compensator has a common mode rejection circuit that isolates the portion of the sensor signal that is a function of the mechanical response of the sensoriactuator by removing the estimated electrical response generated by the modeling circuit. A capacitor is used to roughly approximate the capacitance of the sensoriactuator. And the electrical response of the capacitor is modified by an amplifier, gain of which controlled in response to a comparison of the sensor signal and the training signal. Specifically, the filter modulates the gain of the amplifier to maximize incoherence between the training signal, or electrical input to the sensoriactuator, and the portion of the sensor signal that is attributed to the mechanical response. This operation results in the capacitor-amplifier system producing an electrical response that mirrors the electrical response of the sensoriactuator.

The above and other features of the invention including various novel details of construction and combinations of parts, and other advantages, will now be more particularly described with reference to the accompanying drawings and pointed out in the claims. It will be understood that the particular method and device embodying the invention is shown by way of illustration and not as a limitation of the invention. The principles and features of this invention may be employed in various and numerous embodiments without the departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DESCRIPTION OF PREFERRED EMBODIMENTS

Figure 1:
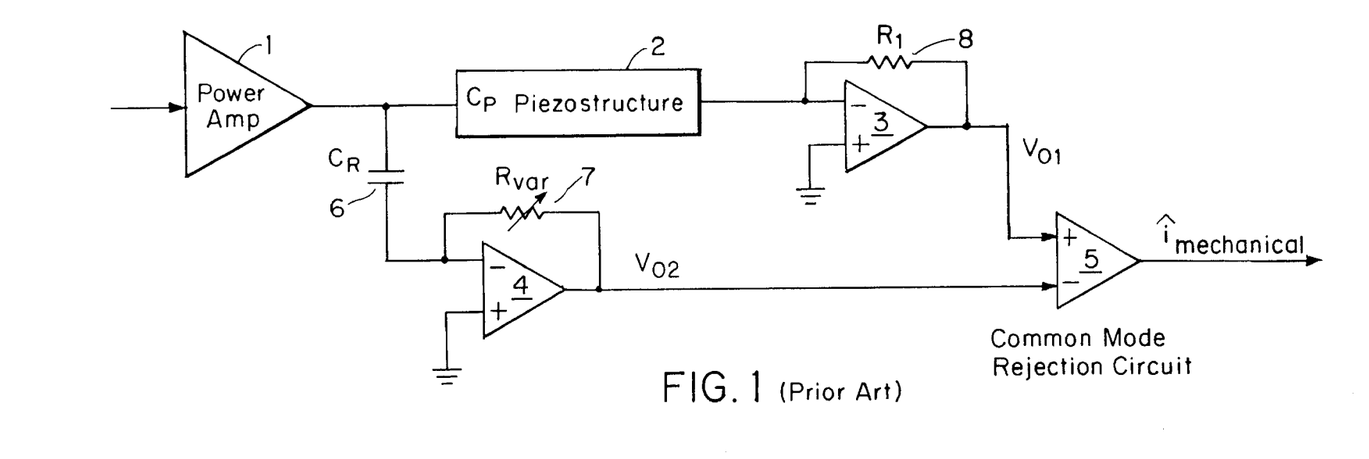
FIG. 1 is a circuit diagram of a prior art analog circuit for resolving a mechanical response of the piezostructure.

By way background, FIG. 1 illustrates a prior art passive, or manual, analog circuit used to resolve the mechanical strain rate from the electrical response of a piezostructure (PS) 2. In the circuit, the piezostructure 2 and a reference capacitor 6 commonly receive the input signal, which drives the piezostructure 2, from a power amplifier 1. The two current amplifiers 3 and 4 (e.g. 741 operational amplifiers) are implemented such that the time derivative of charge, i.e. current, can be monitored from the piezostructure 2 and the reference capacitor 6. If the reference capacitor 6 has the same capacitance as the piezostructure 2, and the gain across current amps 3 and 4 are equivalent, then the output of a common mode rejection (CMR) circuit 5, e.g., an AMP02 op-amp, is simply the mechanical response of the structure 2. Discrepancies in the capacitance of capacitor 6 and piezostructure 2 can be compensated for by manually turning the gain of current amplifier 4 using a variable resistor 7. The resistor is changed until the electrical responses are observed to cancel at CMR 5.

A few problems, however, plague the practical implementation of the circuit of FIG. 1. First, since the mechanical response of PS 2 is often multiple orders of magnitude below the electrical response, adjustment of resistor 7 proves difficult. Often, a 'fine-tune' variable resistor is implemented in series with resistor 7 to facilitate the critical sensitive adjustment. In addition, many changing environmental conditions affect the capacitance of the PS 2 in time, requiring that the circuit be periodically re-turned.

Figure 2A:
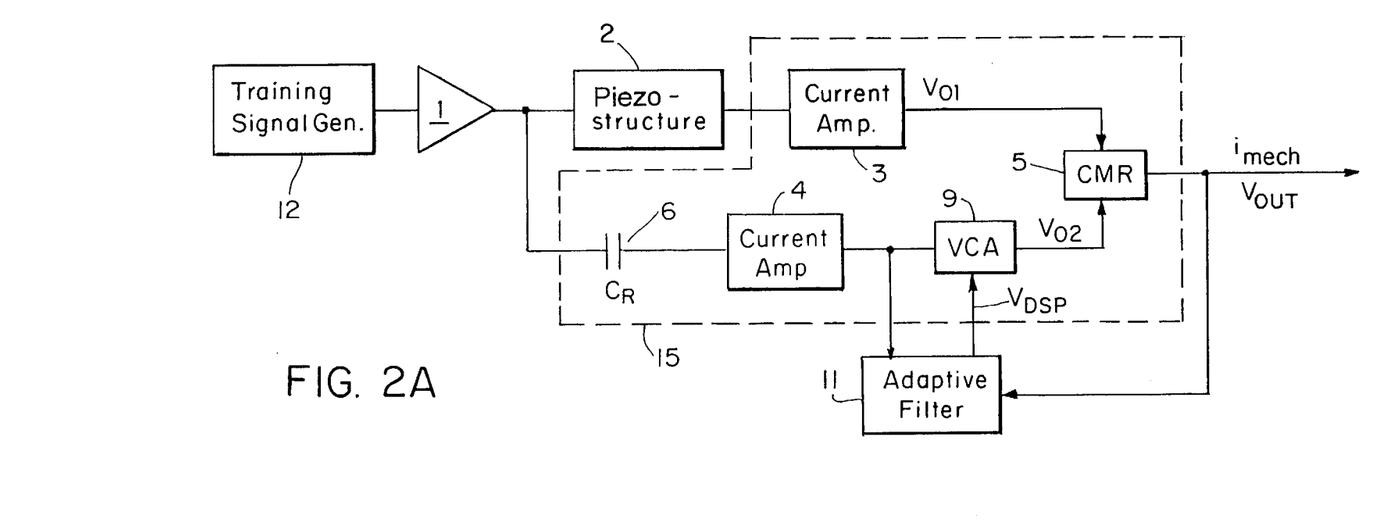
FIG. 2A is block diagram of the adaptive compensation circuit of the present invention.

FIG. 2A is a block diagram illustrating an adaptive sensoriactuator, which has been constructed according to the principles of the present invention. Accordingly, the capacitance of the sensoriactuation is estimated in-situ for a practical implementation of direct-rate feedback control, for example.

In detail, as in FIG. 1, the output of piezostructure 2 and reference capacitor 6 are conditioned by current amplifiers 3 and 4, respectively. The variable resistor 7 of FIG. 1, however, is replaced by a voltage controlled amplifier (VCA) 9. A common mode rejection circuit (CMR) 5 receives and combines the output of VCA 9 and the output of current amplifier 3. A training signal generator 12 produces a random input signal, i.e., band limited noise signal, to train an adaptive filter 11. This process can occur on-line, simultaneously with control, or alternatively prior to or during latency periods in control. The adaptive filter 11 receives two signals, the output of current amplifier 4 and the common mode rejection circuit 5 and sends out a single signal, $V_{DSP}$, which is proportional to the digital filter weight, w(k).

Changing the gain of the VCA 9 effectively changes the capacitance $C_R$ of reference capacitor 6. Essentially, the adaptive filter 11 seeks to minimize the portion of the output of the CMR 5 that is coherent with voltage $V_{O2}$, i.e., the electrical response of the capacitor $C_R$, and thereby adapt the circuit 15 to track the capacitance of the PS 2. This is accomplished by controlling the gain of the VCA 9, which effectively changes the capacitance of the reference capacitor $C_R$. Therefore, $i_{mech}$ is a function of the mechanical response of the piezostructure 2 since the electrical response is removed by the accurate tracking of changes in the piezostructure's capacitance. The training signal serves as a basis for comparing the electrical response of the capacitor $C_R$ to the portion of the electrical response of the PS 2 that is coherent with the signal from $C_R$.

The training signal enables the adaptive filter 11 to converge to a solution by providing an input to the piezostructure that is uncorrelated to the plant response. Preferably, the bandwidth of the signal is the same or greater than the control frequency spectrum. Ideally, the signal is stochastic but a combination of randomly phased harmonics is possible. A single harmonic, however, has been shown to converge the filter 11 to a wrong solution.

Figure 2B:
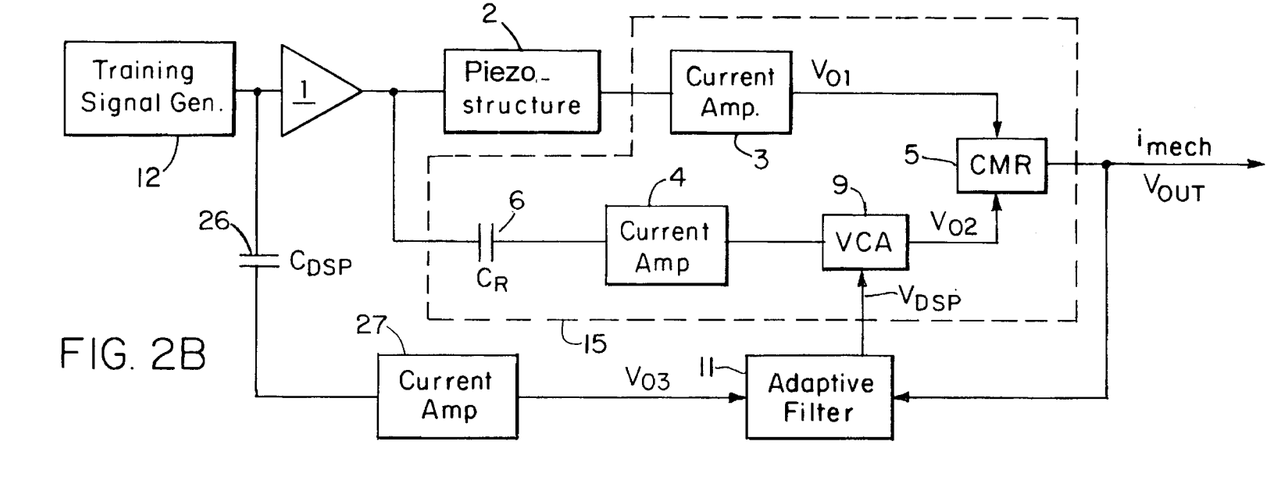
FIG. 2B is a block diagram of an alternative embodiment of the adaptive compensation circuit.

One potential drawback of the embodiment shown in FIG. 2A is the fact that when feedback is applied, reference capacitor 6 is driven by both the training signal and the plant output. As a result, the adaptive filter 11 may try to cancel a portion of the plant response that is coherent with voltage $V_{O2}$ (t). To avoid this potential possibility, a third leg comprising a new capacitor $C_{DSP}$ 26 and a third current amplifier 27 are added between the training signal generator 12 and the adaptive filter 11. This leg simply differentiates the training signal to update the adaptive filter 11. Consequently, the value of capacitor $C_{DSP}$ 26 is relatively inconsequential. The voltage controlled oscillator 9 is still adapted to the correct solution because $V_{out}$ and the training component of $V_{O2}$ (t) is coherent to $V_{O3}$ (t), the output of current amplifier 27. Therefore, capacitor $C_{DSP}$ and current amp 27 ensure that the gain of the voltage controlled oscillator is adjusted by a signal entirely uncorrelated to the plant response.

In still other embodiments, capacitor $C_{DSP}$ 26 and current amplifier 27 could be directly implemented in the adaptive filter 11 and the training signal generator 12 directly sampled by the adaptive filter.

Figure 3:
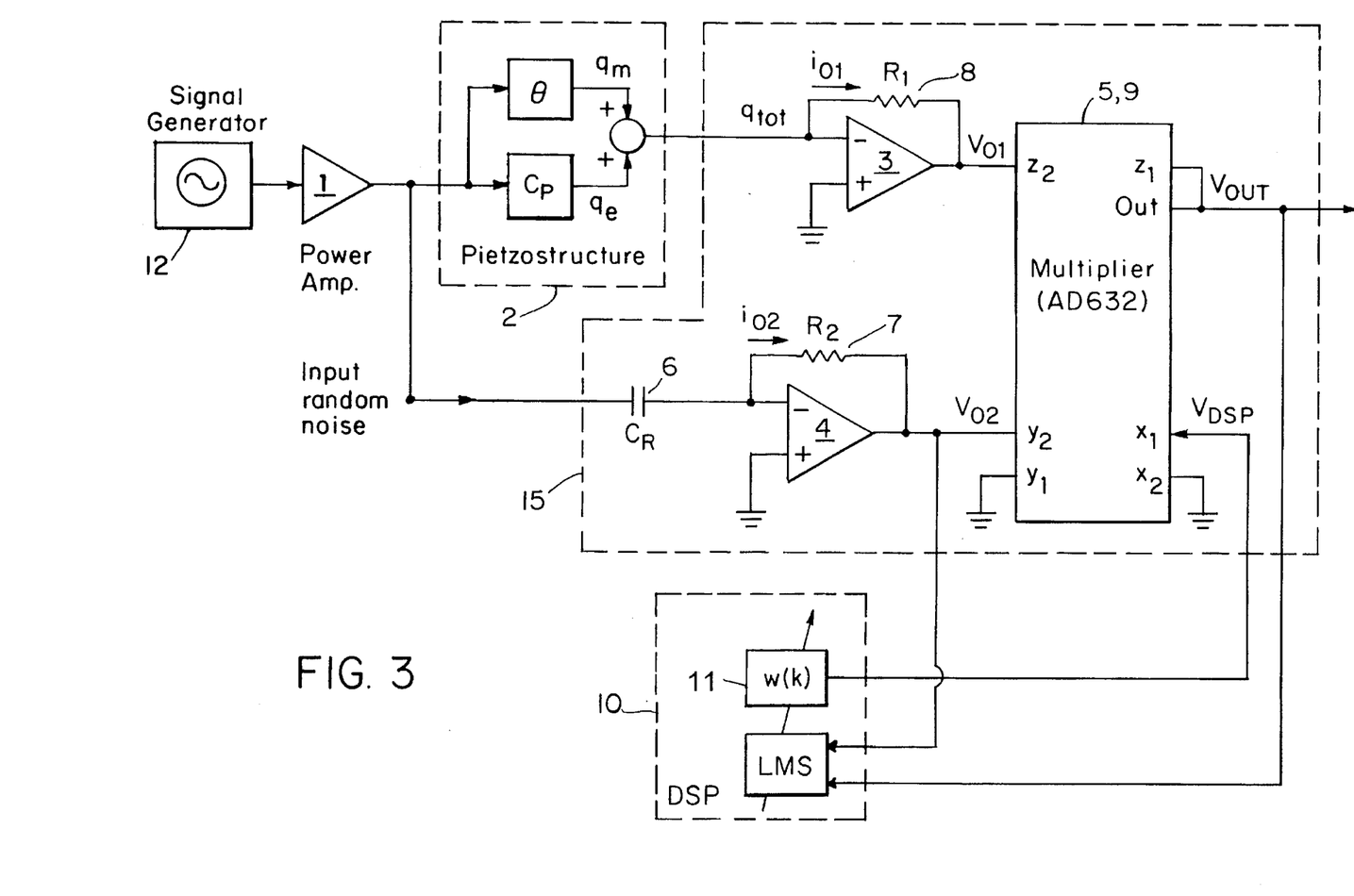
FIG. 3 is a circuit diagram of a hybrid analog/digital adaptive compensation circuit of the present invention.

FIG. 3 is a circuit diagram of the hybrid analog/adaptive circuit shown in FIG. 2A. There are many different implementations of the VCA 9 and CMR 5. The AD632 analog multiplier chip 5,9 was chosen for the VCA because of its common mode rejection (CMR) capability, thus eliminating the need for a separate the CMR 5 shown in FIG. 2. Now, the adjustment in capacitance 6 is made via the multiplication of a voltage, $V_{DSP}$ with the output of current amp 4. Voltage, $V_{DSP}$, is determined by a digital signal processor (DSP) 10 by minimizing the output voltage from multiplier 5,9, $V_{Out}$ with a quadratic gradient search technique. From FIG. 3, $$V_{01}(s) = \mathcal{L}[-R_1 i_{01}(t)] \tag{3a}$$

$$= \mathcal{L}\left[-R_1\left(C_p \frac{dv_{pa}(t)}{dt} - i_{mech}(t)\right)\right] \tag{3b}$$

$$= -sR_1 C_p V_{pa}(s) - R_1 i_{mech}(s) \tag{3c}$$

where $\mathcal{L}[\bullet]$ denotes the Laplace transform, t is the time variable, s is the Laplace variable, and all other variables represent electronic components from the figure. Similarly, $$V_{02}(s) = -sR_2 C_R V_{pa}(s)$$

which leads to $$V_{Out}(s) = \frac{V_{DSP}(-sR_2 C_R V_{pa}(s))}{10V} - sR_1 C_p V_{pa}(s) - R_1 i_{mech}(s) \tag{5}$$

By inspection, $V_{Out}(s)$ is equal to the mechanical response of the Piezostructure, $R_1 i_{mech}$, when $$V_{DSP} \equiv \frac{10R_1 C_p}{R_2 C_R} \text{ Volts} \tag{6}$$

The d.c. voltage is controlled with a digital signal processor as illustrated and is adapted with the least-mean squares (LMS) algorithm. See Widrow, Bernard and Samuel D. Stearns, 1985, *Adaptive Signal Processing*, Prentice Hall, Englewood Cliff, N.J. which is incorporated herein by reference in its entirety. This was outlined previously by Cole, Daniel G., and Robert L. Clark, Sep. 1994, "Adaptive Compensation of Piezoelectric Sensoriactuators," *Journal of Intelligent Material Systems and Structures*, Vol. 5, 665–672 which is also incorporated herein by reference in its entirety. It is important to point out that the adaptive LMS algorithm can be implemented in analog, eliminating the need for the DSP 10, altogether. Further, the invention is not limited to the LMS algorithm—any gradient descent algorithm could be used. The cost function that is minimized is defined as $$C(w(k)) = E[V_{Out}^2] \tag{7}$$

where $E[\bullet]$ denotes the expectation operator, and $w(k)$ is the digital filter wight. The quadratic cost is minimized using steepest descent $$w(k+1) = w(k) - \mu \nabla C(w(k)) \tag{8a}$$

$$= w(k) - \mu 2E\left[V_{Out} \frac{\partial V_{Out}}{\partial w}\right] \tag{8b}$$

where k is the discrete time step, $\mu$ is a step size parameter that controls stability and convergence, and $w(k)$ is the signal coefficient finite impulse response (FIR) filter required to adapt the capacitance, which is equivalent to the output voltage, $V_{DSP}$. The LMS algorithm uses a stochastic estimate of the gradient.

$$w(k+1) \approx w(k) + \mu 2 V_{Out}(k) \frac{V_{02}(k)}{10V} \tag{9}$$

The difference here is that the adaptive coefficient is implemented in analog ($V_{DSP} \equiv w(k+1)$) such that the controller can be implemented in analog as well to maintain stability guarantees associated with collocated rate-feedback control. Balas, M. J., "Direct Velocity Feedback Control of Large Space Structures," *Journal of Guidance and Control*, 2(3), 252–253. The ability to adapt the circuit is accomplished via the voltage controlled amplifier: an AD632 analog multiplier chip, which has a signal to noise ratio (SNR) and a common mode rejection ratio (CMRR) of approximately 80 dB.

One alternative implementation to that shown in FIG. 3 would allow the removal of the physical reference capacitor 6. This electrical element could be modeled in the digital signal processor 10. This configuration, however, while simplifying the overall circuit, could present the number of difficulties. The phase of the reference capacitor 6 must match the phase of the piezostructure 2 within a few tenths of a degree. Mapping a differentiator-capacitor to the discrete domain would add phase errors. In addition, the feedback loop is no longer pure analog since the part of the signal, the reference length, is directly filtered by the digital signal processor 10. The DSP 10 adds an unacceptable linear phase response due to the pure time delay associated with the sampling process. As a result, in many situations, such a configuration would have a limited bandwidth and may require additional compensators.

In other implementations, it may be possible to eliminate the training signal. Generally, the training signal is required since a signal, which is uncorrolated to the plant response, is necessary to predict the piezostructure's capacitance. Inverse modeling, however, could provide a means for eliminating this requirement.

Experimental Verification

Figure 4:
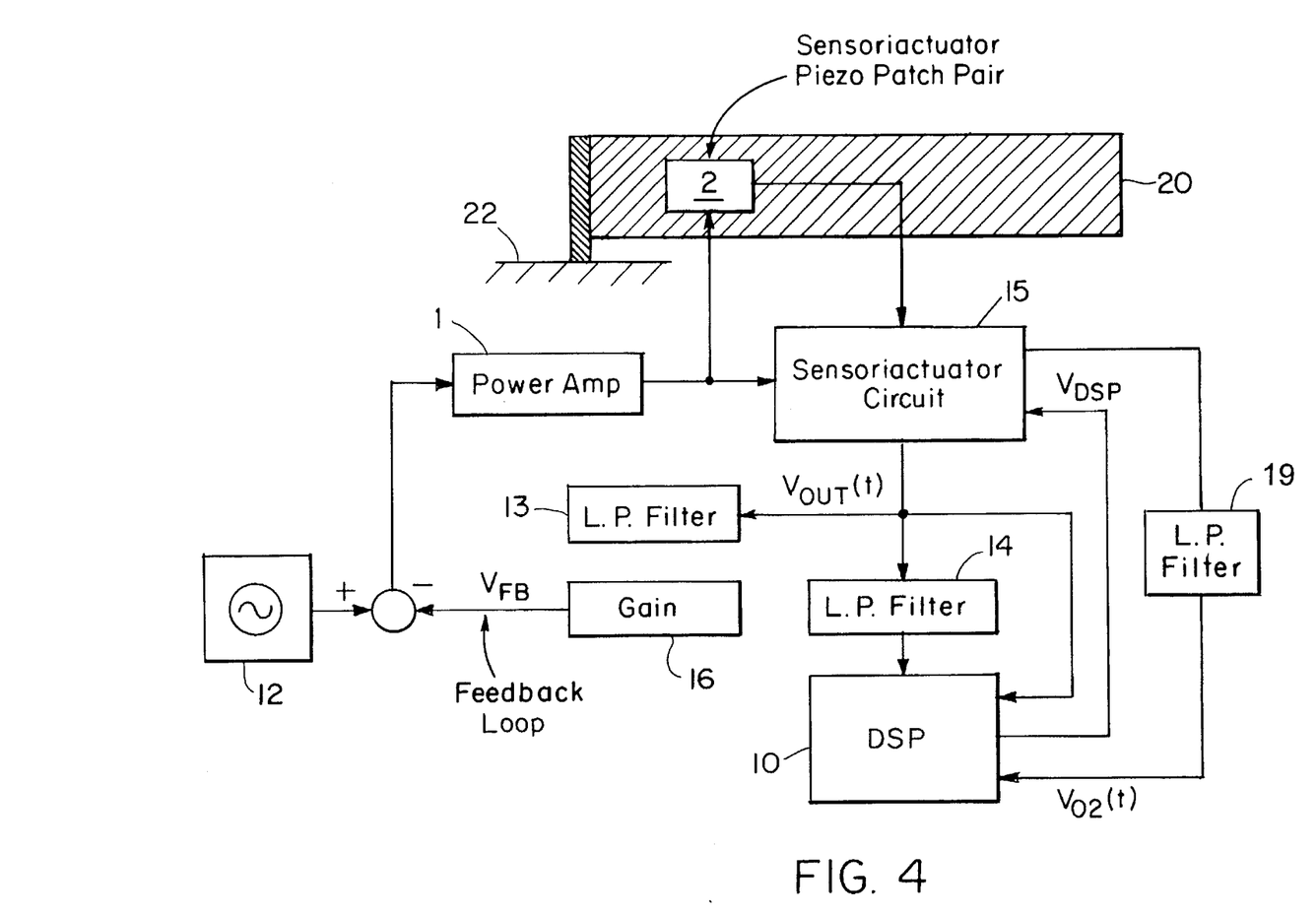
FIG. 4 is a schematic diagram showing an experimental setup implementing the adaptive sensoriactuator system of the invention.

An experiment was devised to demonstrate the abilities of the analog/digital compensation of a piezoelectric sensoriactuator. FIG. 4 is a schematic diagram depicting the experimental setup. The beam 20 was made of plain carbon steel and was clamped to an optical bench 22 for the duration of the experiments. Table 1 lists the theoretical and experimentally measured natural frequencies and damping ratios of the first four bending modes of the beam 20. These properties were estimated from the measured frequency response function (FRF) using a curve-fitting program.

TABLE 1

| | Modal Properties of Beam | | |
|---|---|---|---|
| Mode | Theor. Natural Freq. (Hz) | Measured Resonant Freq. (Hz) | Measured Damping Ratio |
| 1 | 5.39 | 5.27 | 0.00230 |
| 2 | 33.7 | 32.9 | 0.00950 |
| 3 | 94.2 | 91.1 | 0.00205 |
| 4 | 185 | 171 | 0.00750 |

Figure 5:
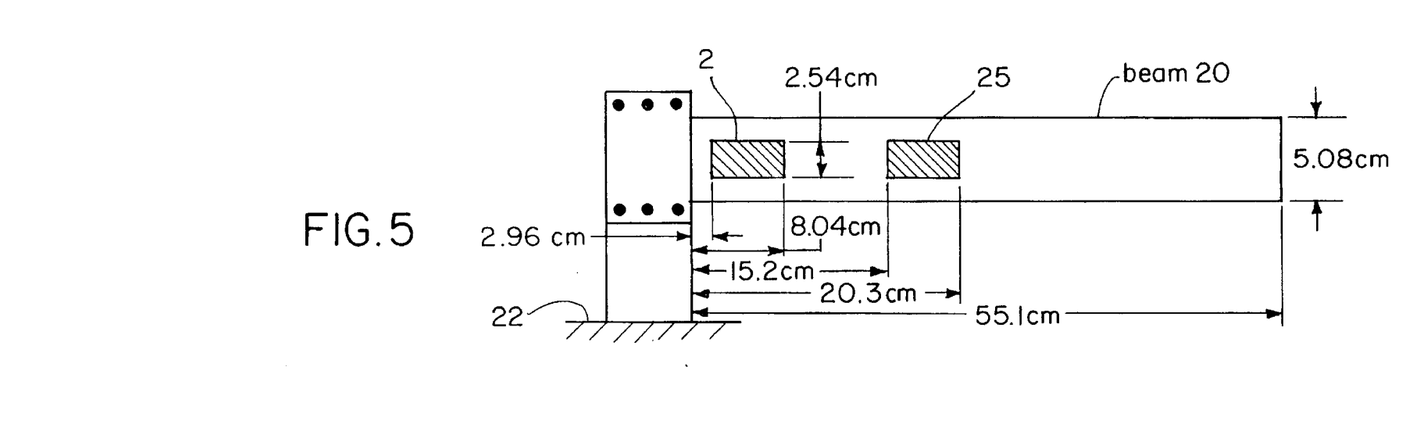
FIG. 5 shows the dimensions and locations of beam transducers for the experimental setup.

The sensoriactuator 2 was a piezoelectric bending motor coupled with the digital/analog circuit depicted in FIG. 3. The bending motor is a pair of G1195 PZT patches mounted symmetrically about the beam neutral axis and wired out of phase to produce pure bending (in theory). The exact locations of these transducers as well as a disturbance piezoelectric patch pair 25 and the beam dimension are shown in FIG. 5. A Krohn-Hite Model 7600 wideband amplifier 1 was used to drive the sensoriactuator 2. Two Ithaco 4302 low-pass Bessel filters 14 and 19 were used as anti-aliasing filters before the sensoriactuator output was sampled with DSP 10. Low pass filter 13 was placed in the feedback loop for stability and remove high frequency noise. A Tektronix 2630 4-channel spectrum analyzer was used for all time and frequency domain analysis and an on-board signal generator 12 was used to produce the bandlimited broadband signal required to excite the sensoriactuator 2. A TMS320C30-based DSP 10 in a PENTIUM™ host computer was used to adapt the analog circuit.

Figure 6A:
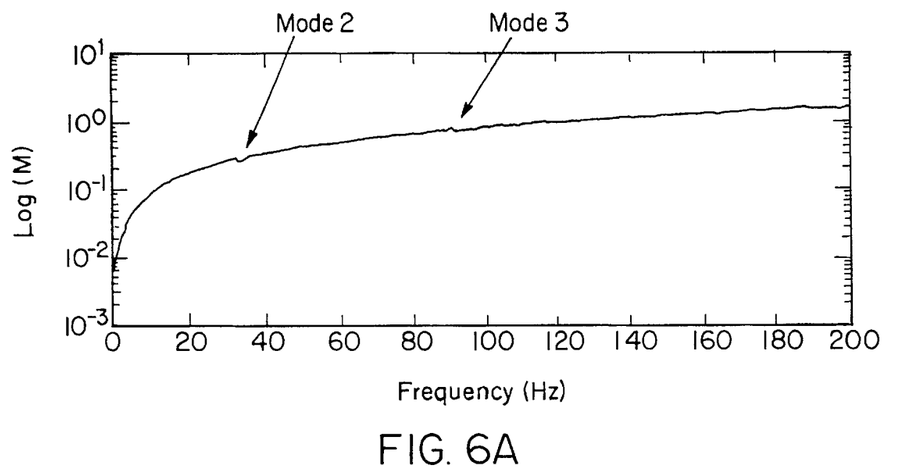
FIGS. 6A and 6B are frequency response functions for the magnitude and phase, respectively, of the uncompensated sensoriactuator.
Figure 6B:
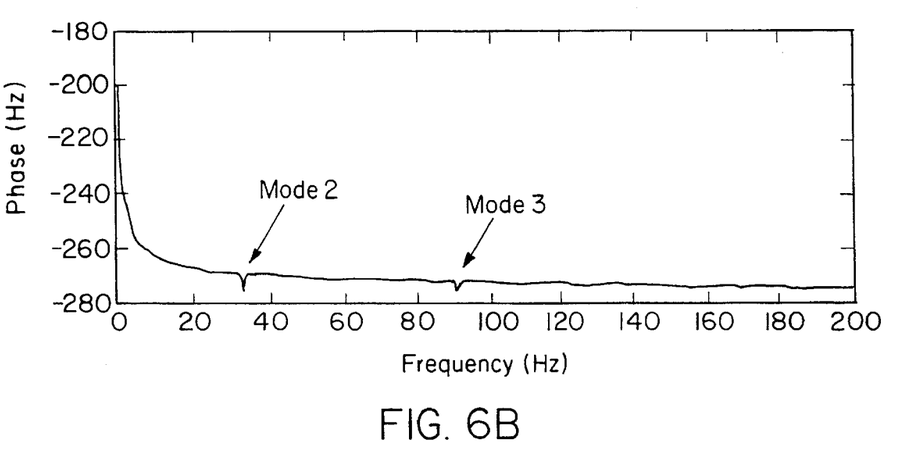

The open loop response of the sensoriactuator was investigated experimentally. First, the circuit output with no compensation of the feedthrough dynamics ($V_{DSP}=0$) was measured. The frequency response function (FRF) between the 0–200 Hz random input and the sensoriactuator output signal is shown in FIGS. 6A and 6B. The curves generally reflect the high pass characteristics of the capacitive electrical response of the piezoelectric element. The resonant peaks of the second and third beam modes can barely be recognized, as denoted in the figure. Next, the LMS algorithm was implemented in conjunction with the DSP 10, setting the convergence parameter to 0.05 and the sampling rate of the DSP to 2 kHz. A much smaller signal results since the current induced in the piezoceramic transducer due to the applied voltage is much larger than that induced in the device by the mechanical strain.

Figure 7A:
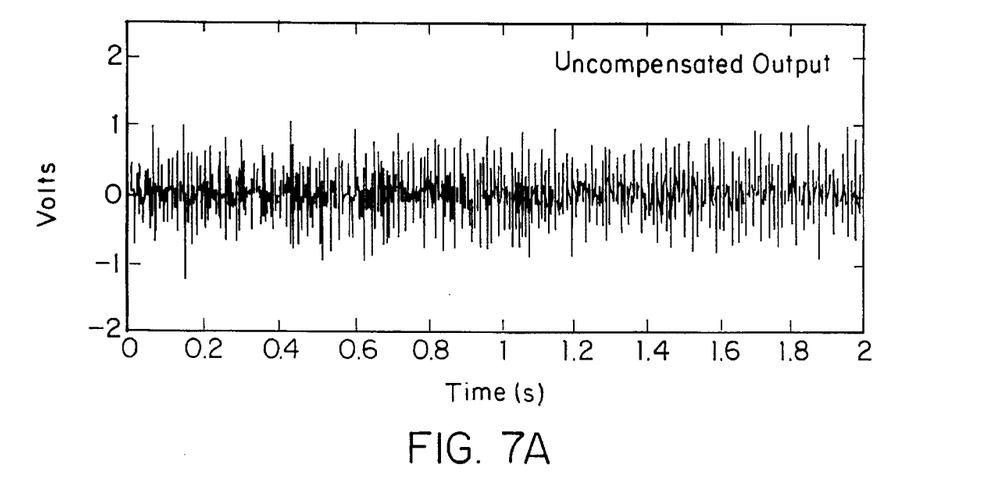
FIGS. 7A and 7B are the measured sensoriactuator outputs without and with compensation, respectively.
Figure 7B:
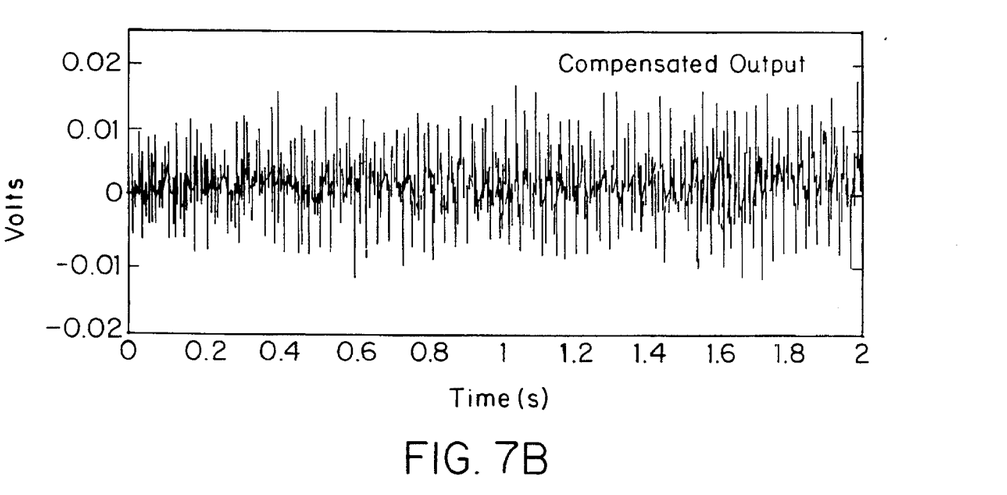
Figure 8A:
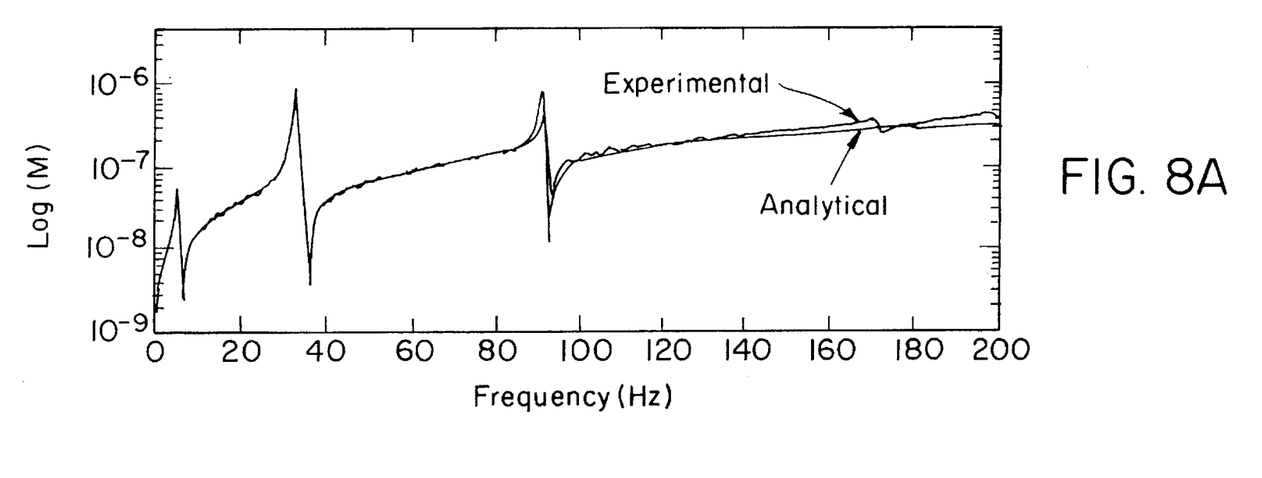
FIGS. 8A and 8B are comparisons of the experimental and analytical frequency responses of a fully compensated sensoriactuator for magnitude and phase, respectively.
Figure 8B:
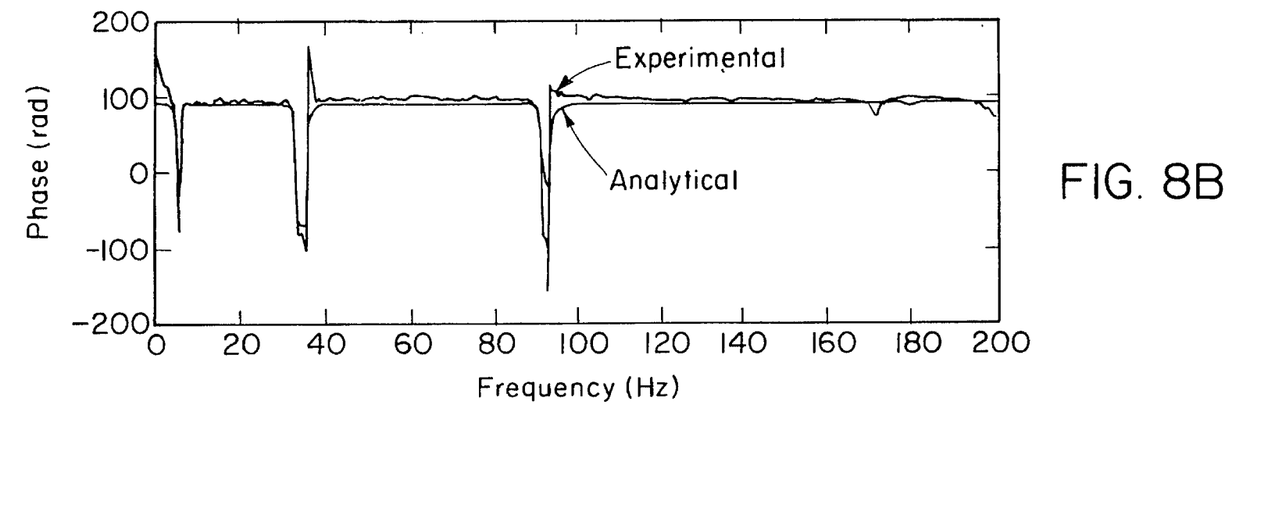

FIGS. 7A and 7B show the voltage signals measured from the sensoriactuator circuit 5, with and without feedthrough compensation. The compensated output is roughly two orders of magnitude smaller than the uncompensated signal, bringing to light the difficulty associated with extracting the mechanical response (a dynamic range issue). As indicated in FIG. 3, a reference capacitor is used for gross phase-compensation. If required, gains can be applied to the inputs of the DSP to ensure that the maximum dynamic range of the analog-to-digital (A/D) converters is utilized in the "fine tuning" process. Computing the frequency response function of the compensated output reveals the dynamics of the beam. This plot is compared to the frequency response of the analytical model having no capacitive feedthrough dynamics as shown in FIGS. 8A and 8B. The good agreement in location of the zeros indicates that the hybrid sensoriactuator did indeed adequately compensate the feedthrough dynamics.

Closed-Loop Control

Control of the beam response was demonstrated while simultaneously adapting the capacitance of the piezoelectric patch. No effort was made to optimize the feedback gain or feedback compensator; the intention was merely to demonstrate feasibility of the adaptive sensoriactuator. A low-level band limited random noise was used to provide the training signal for the adaptive sensoriactuator while having a relatively insignificant effect on the system response. The adaptive digital filter can only remove components of the sensoriactuator circuit output that are coherent to the input to the adaptive digital filter, i.e, $V_{o2}(t)$, while all other signals will not affect the adaptation process. Hence it is possible to adapt the sensoriactuator while using it for control of persistent or transient disturbances.

Figure 9:
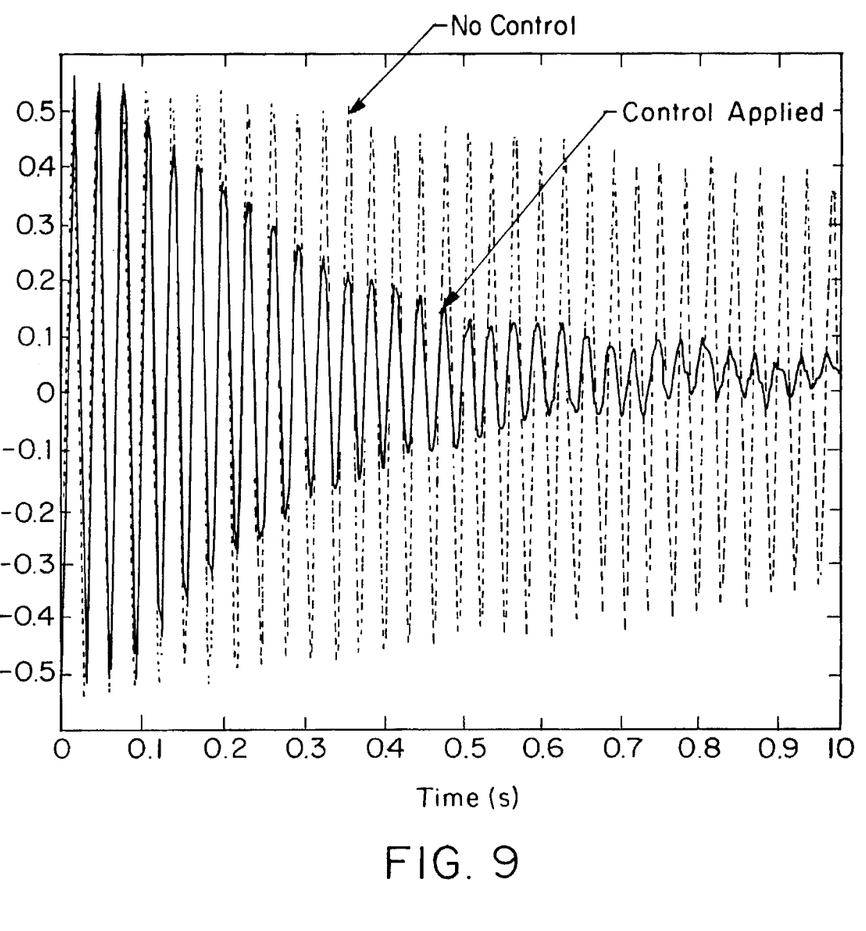
FIG. 9 shows a comparison of no control and the results of rate feedback control using the adaptive sensoriactuator of the present invention.

To demonstrate the control, the beam was driven near the second mode resonance and allowed to freely decay. The same experiment was repeated with the rate feedback (RFB) control applied. The locations of the poles and zeros along with the limited bandwidth of the controller made the second mode the best candidate for active damping for this particular system. FIG. 9 shows this response of the beam (with solid line) and without RFB (dotted line) control overlayed with each other. The magnitudes of the time histories have been adjusted by a factor of 2.7 so that steady-state values of the time histories are equivalent since RFB control significantly reduces the plant response near a resonance of a lightly-damped mode. A log decrement calculation was used to estimate the increase in damping: more than a factor of six when RFB control is applied. After the disturbance is removed and the beam response decays to steady-state, one can vaguely see the random noise that is used to tune the sensoriactuator circuit. The output voltage $V_{DSP}$ was monitored and remained relatively constant during the process and consequently is not shown here.

Measurement of Dynamic Piezoelectric Capacitance

An important result of this work is the ability to dynamically measure the "quasi-blocked" capacitance in-situ mounted to a structure with some compliance. By knowing the internal gains across the sensoriactuator network and the reference capacitance, the blocked capacitance for this sensoriactuator is determined to be $$C_P^s = \frac{R_1 V_{DSP}}{10 R_2} C_R \tag{10}$$

$$= \frac{(4.31 k\Omega)(5.29V)}{(2.192 k\Omega)(10V)} \; 0.104 \, \mu F = 0.108 \, \mu F \tag{11}$$

where $R_1$, $R_2$ are gain resistors 8 and 7, respectively, depicted in FIG. 3, $C_R$ is the reference capacitor 6, and 10 V is an internal gain in the AD632 multiplier chip 9. When the capacitance of the mounted piezo bending motor is measured using a Fluke 87 multimeter, the value is 0.112 µF. Therefore, an error of 3.7% in the estimation of the capacitance would have resulted. This overestimation of the blocked capacitance can potentially lead to instabilities in rate feedback control.

On-Line System Health Monitoring

Figure 10A:
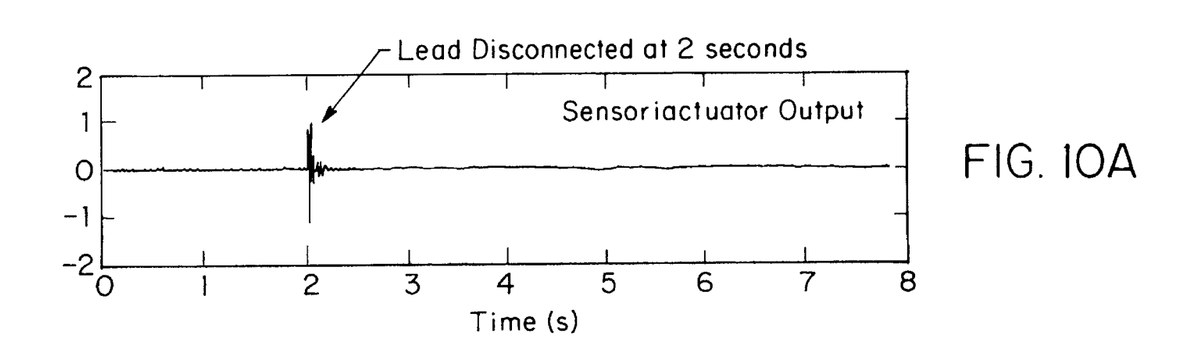
FIGS. 10A, 10B, and 10C show sensoriactuator output, dynamic capacitance, and edge detector output, respectively, after one of the piezo patches in the bending motor is disconnected.
Figure 10B:
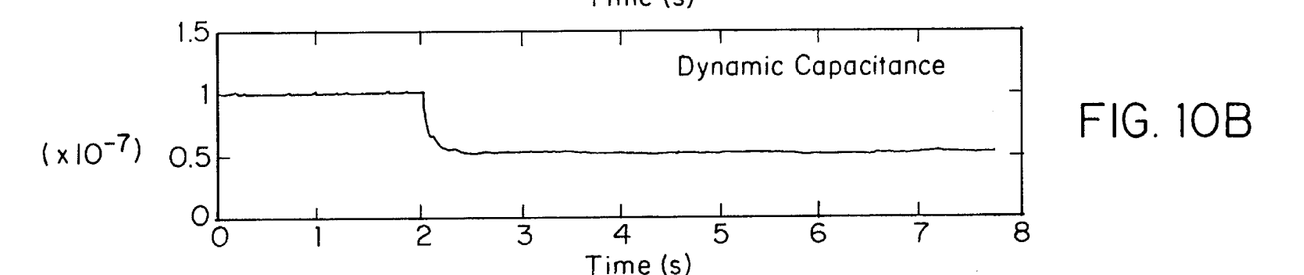
Figure 10C:
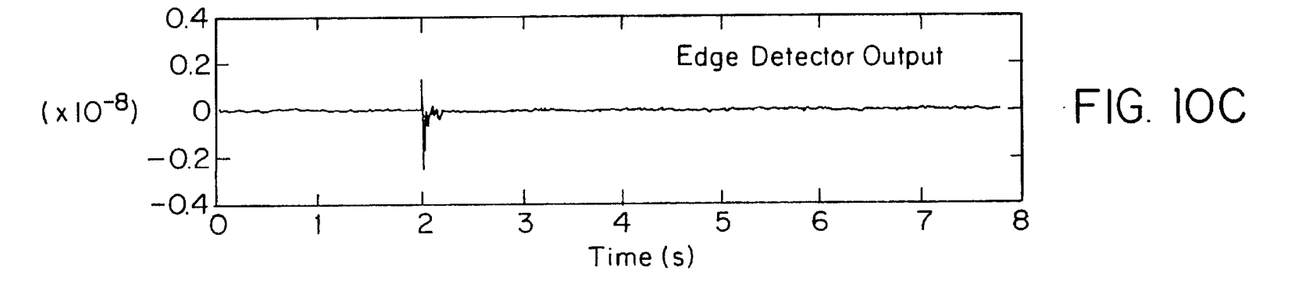

Besides making rate feedback control with sensoriactuators practical, the adaptive sensoriactuator lends itself well to system health monitoring. If a piezoelectric sensoriactuator fails, a change in the capacitance will likely be experienced. To demonstrate this, the circuit was first allowed to adapt to the steady-state capacitance and then one of the piezo patches used to construct the bending motor was suddenly disconnected from the circuit. Consequently, a single patch having roughly half the original capacitance began serving as the sensoriactuator. In the dynamic capacitance time history of FIG. 10B one observes that the circuit re-converged to the new capacitance which is approximately half the original capacitance. In the sensoriactuator output time history of FIG. 10A, one observes that when the lead is disconnected, the electrical response briefly dominates the output of the sensoriactuator until the circuit reconverges. A convergence parameter of 0.1 was used here. This capacitance can easily be monitored for health using a simple differencer or edge-detector to look for a sudden change in capacitance. The output of the edge-detector, y(k) is the difference of the present and past estimated discrete dynamic capacitance values, $\hat{C}_p(k)$, $\hat{C}_p(k-1)$.

$$y(k) = \hat{C}_p(k) - \hat{C}_p(k-1) \tag{12}$$

where k is the sample index. No new signals need to be sampled since the DSP already has available the estimated dynamic capacitance, $\hat{C}_p(k) \propto V_{DSP}$. The edge detector time history of FIG. 10C shows the edge-detector output, and there is a spike when the lead is disconnected. The magnitude of the spike is much greater than the noise floor of the already noisy, discrete differentiator. If the edge detector output exceeds a predetermined threshold for the system, it can be concluded that the integrity of the sensoriactuator circuit has been compromised somehow.

Figure 11A:
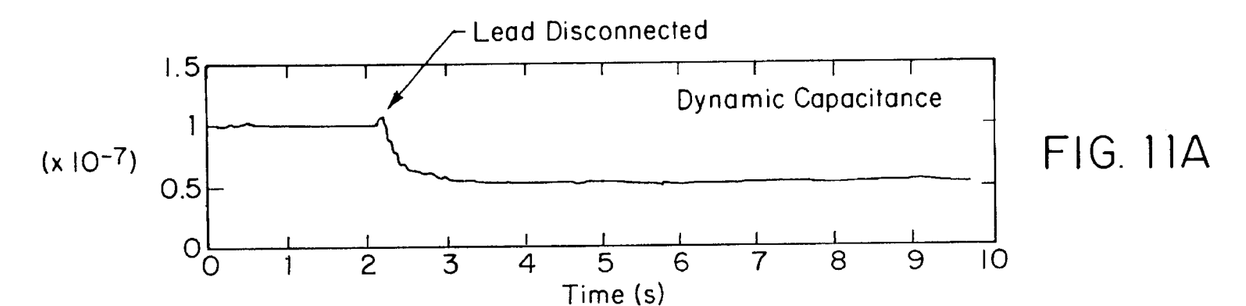
FIG. 11A, 11B, and 11C show the dynamic piezoceramic capacitance, edge detector output, and edge detector output using decimation, respectively, illustrating that decimation allows edge detection when smaller convergence parameters are used.
Figure 11B:
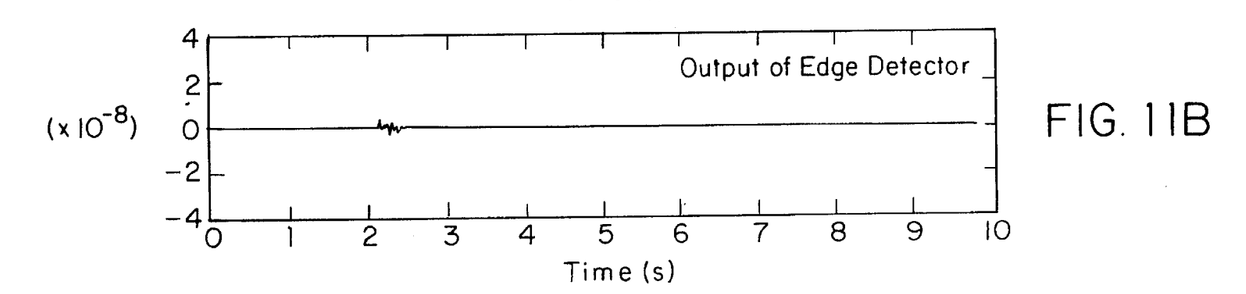
Figure 11C:
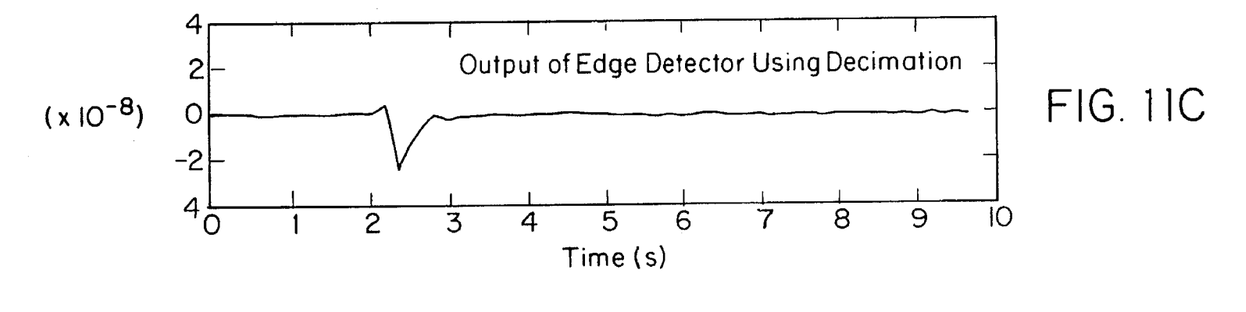

A sudden change in capacitance here will depend on the learning parameter, $\mu$ used in the adaption of the digital filter. Because high rates of convergence may affect the stability of the closed-loop system, decimation, see Oppenheim, Alan V. and Ronald W. Schafer, 1989, *Discrete-Time Signal Processing*, Prentice Hall, Englewood Cliffs, N.J., can be used to emphasize the "edge" to be detected. FIGS. 11A, 11B, and 11C demonstrate how decimation improves the output of the edge detector when a convergence parameter of 0.01 (order of magnitude smaller) is used. As expected, the dynamic capacitance reaches the new steady-state noticeably slower with the smaller $\mu$ (see Dynamic capacitance time history of FIG. 11A). Unless sample points are skipped, the change in the capacitance is not fast enough to cause a distinct output spike that is well above the noise floor of the edge detector (see edge detector output time history of FIG. 11B). In the edge detector time history using decimation of FIG. 11C, the signal was sampled every 80 points, a value which can be determined based on the size of the convergence parameter. A much larger, distinctive spike occurs. If desired, different decimation rates could be used concurrently, to monitor capacitance changes across different time scales.

Alternate Embodiments

The digital signal processor (DSP) could be eliminated entirely by using an analog implementation of the LMS algorithm. This would cheapen the implementation considerably.

The adaptive algorithm is not limited to the LMS algorithm, but any gradient descent or other minimization algorithm, quadratic for example, could be used.

There are many other realizations of a VCA, any of which could be incorporated in this invention. The AD632 analog multiplier chip was chosen for its good linear response and CMR capabilities. Alternatively, an operational transconductance amplifier can be used as a VCA. An alternate digitally controlled VCA can be realized using digital switches in combination with a feedback resistor array. A binary input selects which resistors to group in parallel for the feedback resistance. A similar effect can be achieved using a digital to analog converter (DAC) as a linear, digitally controlled resistor. If the DAC is capable of handling a bipolar input voltage, then the ac input signal can be supplied as the "reference" signal to the DAC and the digital input selects the scaling of this ac signal. Whichever VCA is used, the effect is the same: to allow the circuit to adaptively compensate the feedthrough capacitance of the sensoriactuator.

While this invention has been particularly shown and described with references to preferred embodiments thereof, it will be understood by those skilled in the art that various changes in form and details may be made therein without departing from the spirit and scope of the invention as defined by the appended claims. For example, the applicability of the invention is not limited feedback control. Often applications such as impedance measurements, modal analysis, on-line system health monitoring are also possible.

We claim:

1. An adaptive sensoriactuator system, comprising:

a signal generator for generating a training signal;

a sensoriactuator, being responsive to the training signal, for generating a sensor signal that is a function of its electrical response and mechanical response; and a compensator for resolving a portion of the sensor signal that results from the mechanical response by estimating the electrical response from a comparison of the training signal and the sensor signal.

2. A system as described in claim 1, wherein the training signal generated by the signal generator is a continuous frequency spectrum signal.

3. A system as described in claim 1, wherein the sensoriactuator is a piezoelectric structure.

4. A system as described in claim 1, wherein the compensator comprises a modeling circuit that is responsive to the training signal and models the capacitance of the sensoriactuator to estimate the electrical response of the sensoriactuator.

5. A system as described in claim 4, wherein the compensator further comprises a common mode rejection circuit that isolates the portion of the sensor signal that is a function of the mechanical response of the sensoriactuator by removing the estimated electrical response generated by the modeling circuit.

6. A system as described in claim 4, wherein the modeling circuit comprises a capacitor that has a capacitance which is approximately equal to the capacitance of the sensoriactuator and an amplifier, a gain of which controlled in response to a comparison of the sensor signal and the training signal.

7. A system as described in claim 6, further comprising an adaptive filter for comparing the sensor signal to the training signal and for modulating the gain of the amplifier to maximize incoherence between the training signal and the portion of the sensor signal that is attributed to the mechanical response.

8. A system as described in claim 1, wherein the compensator resolves the mechanical response by maximizing the incoherence between the training signal and the portion of the sensor signal that is attributed to the mechanical response.

9. A method for resolving a mechanical response of sensoriactuator, the method comprising:

driving the sensoriactuator with an input signal;

generating an estimated electrical response of the sensoriactuator in response to the input signal;

resolving the mechanical response of the sensoriactuator by comparing the estimated electrical response to an output signal of the sensoriactuator; and modifying the estimated electrical response to minimize coherence between the mechanical response and the estimated electrical response.

10. A method as described in claim 9, further comprising driving the sensoriactuator with feedback derived from the mechanical response of the sensoriactuator.

11. A method as described in claim 9, further comprising driving the sensoriactuator with a training signal.

12. A method as described in claim 11, wherein the training signal is a band limited noise signal.

13. A method as described in claim 11, further comprising generating the estimated electrical by approximating a capacitance of the sensoriactuator.

14. A method as described in claim 11, further comprising generating the estimated electrical response by modeling a capacitance of the sensoriactuator.

15. A method as described in claim 14, further comprising modeling the capacitance of the sensoriactuator by changing the estimated electrical response to maximize the incoherence between the mechanical response and the training signal.

16. An adaptive sensoriactuator system, comprising:

a sensoriactuator, being responsive to an electrical input signal, for generating a sensor signal that is a function of its electrical response to the electrical input signal and its mechanical response; and a compensator for resolving a portion of the sensor signal that results from the mechanical response by estimating the electrical response from a comparison of the electrical input signal and the sensor signal.

* * * * *

UNITED STATES PATENT AND TRADEMARK OFFICE
CERTIFICATE OF CORRECTION

PATENT NO. : 5,578,761
DATED : November 26, 1996
INVENTOR(S) : Robert L. Clark, Jr., Jeffrey S. Vipperman, and Daniel G. Cole It is certified that error appears in the above-indentified patent and that said Letters Patent is hereby corrected as shown below:

In the address of Inventor Jeffrey S. Vipperman, please replace "Hillborough" with ---Hillsborough---;

In Fig. 3, at reference numeral "2", please replace "Pietzostructure" with ---Piezostructure---;

Column 1, line 38, replace "D" with ---$\mathcal{D}$---;

Signed and Sealed this

Twenty-second Day of April, 1997

Attest:

BRUCE LEHMAN

*Commissioner of Patents and Trademarks*

*Attesting Officer*